United States Patent [19]

Sato et al.

[11] Patent Number: 5,800,964
[45] Date of Patent: Sep. 1, 1998

[54] PHOTORESIST COMPOSITION

[75] Inventors: Mitsuru Sato, Yokohama; Kazuyuki Nitta, Koza-gun; Hideo Hada, Hiratsuka; Tatsuya Hashiguchi, Chigasaki; Hiroshi Komano, Koza-gun; Toshimasa Nakayama, Chigasaki, all of Japan

[73] Assignee: Tokyo Ohka Kogyo Co., Ltd., Japan

[21] Appl. No.: 717,779

[22] Filed: Sep. 24, 1996

[30] Foreign Application Priority Data

Sep. 29, 1995 [JP] Japan .................. 7-254215

[51] Int. Cl.$^6$ .................. G03F 7/038; G03F 7/039
[52] U.S. Cl. .................. 430/281.1; 430/270.1; 430/919; 430/921; 522/57
[58] Field of Search .................. 430/281.1, 270.1, 430/919, 921; 522/57

[56] References Cited

U.S. PATENT DOCUMENTS

| | | | |
|---|---|---|---|
| 4,540,598 | 9/1985 | Berner et al. | 427/54.1 |
| 4,736,055 | 4/1988 | Dietliker et al. | 560/13 |
| 5,019,488 | 5/1991 | Mammato et al. | 430/325 |
| 5,216,135 | 6/1993 | Urano et al. | 534/556 |
| 5,585,222 | 12/1996 | Kaimoto et al. | 430/296 |
| 5,660,969 | 8/1997 | Kaimoto | 430/270.1 |

FOREIGN PATENT DOCUMENTS

| | | |
|---|---|---|
| 0 044 115 | 1/1982 | European Pat. Off. . |
| 0 241 423 | 10/1987 | European Pat. Off. . |
| 0 361 907 | 4/1990 | European Pat. Off. . |
| 0 571 330 | 11/1993 | European Pat. Off. . |

OTHER PUBLICATIONS

Grant et al, eds. *Grant & Hackh's Chemical Dictionary*, Fifth ed., McGraw-Hill Book Co, New York, NY, 1987, p. 22.

*Primary Examiner*—Cynthia Hamilton
*Attorney, Agent, or Firm*—Wenderoth, Lind & Ponack, L.L.P.

[57] ABSTRACT

Disclosed is a novel and improved photoresist composition which comprises:

(A) a film-forming resinous compound which is, in the presence of an acid, subject to a change in the solubility in an alkaline solution; and (B) an acid-generating agent capable of releasing an acid by the exposure to actinic rays which is an oxime sulfonate compound represented by the general formula $$NC-CR^1=N-O-SO_2-R^2,$$

in which $R^1$ and $R^2$ are, each independently from the other, an unsubstituted or halogen-substituted monovalent aliphatic hydrocarbon group, e.g., alkyl, cycloalkyl, alkenyl and cycloalkenyl groups. By virtue of the non-aromatic nature of the component (B) as well as good solubility thereof in organic solvents and high acid strength of the acid released therefrom, the composition is highly transparent to deep ultraviolet light even when the content of the component (B) is relatively large and the photosensitivity of the composition is very high so that the photoresist composition is capable of giving a patterned resist layer having excellent characteristics.

11 Claims, No Drawings

PHOTORESIST COMPOSITION

BACKGROUND OF THE INVENTION

The present invention relates to a novel photoresist composition or, more particularly, to an improved photoresist composition containing a film-forming resinous ingredient having susceptibility to a solubility change in the presence of an acid and an ingredient capable of releasing an acid by the irradiation with actinic rays, by which a latent image for patterning is formed in the resist layer giving a patterned resist layer having an orthogonal cross sectional profile without waviness along with excellent characteristics relative to the focusing depth latitude, photosensitivity and heat resistance of the resist layer.

As a trend in recent years relative to the technology of photolithographic patterning in the manufacture of various kinds of semiconductor devices, liquid crystal display devices and the like using a positive- or negative-working photoresist composition, photoresist compositions containing an acid generating agent as mentioned above are highlighted and various kinds of compounds have been proposed and tested as an acid generating agent, of which compounds having an oxime sulfonate group in the molecule capable of releasing a sulfonic acid when irradiated with actinic rays belong to one of the most important classes.

Various kinds of oxime sulfonate group-containing compounds, which may be useful as an acid generating agent in photoresist and related compositions, have been proposed and used in the prior art. For example, European Patent Publication EP 0 044 115 A1 discloses a heat-curable coating composition containing an acid-curable amino resin and an oxime sulfonate compound. Japanese Patent Kokai 60-65072 teaches a method for curing a baking-curable coating composition containing an acid-curable resin and an oxime sulfonate compound by the irradiation with a short-wavelength light. Japanese Patent Kokai 61-251652 discloses an oxime sulfonate compound having a substituent group such as an ethylenically unsaturated polymerizable group, epoxy group, hydroxy group and the like as well as a polymer thereof. Japanese Patent Kokai 1-124848 discloses a method for image patterning by the use of a composition comprising a film-forming organic resin and a photosensitive compound having an oxime sulfonate group and an aromatic group in the molecule. Japanese Patent Kokai 2-154266 discloses a photoresist composition comprising an alkali-soluble resin, oxime sulfonate compound and sensitivity-enhancing cross-linking agent. Japanese Patent Kokai 2-161444 teaches a method for the formation of a negative pattern by the use of an oxime sulfonate compound. Japanese Patent Kokai 6-67433 discloses a photoresist composition containing an oxime sulfonate compound and capable of being cured by the irradiation with the i-line ultraviolet light.

Some of the oxime sulfonate compounds disclosed in the above recited prior art documents have a cyano group in the molecule and they are known to have excellent characteristics as an acid generating agent in a photoresist composition in respects of the high photosensitivity of the photoresist composition compounded therewith and high heat resistance of the patterned resist layer of the composition.

Examples of the prior art oxime sulfonate compounds having a cyano group in the molecule include:

α-(p-toluenesulfonyloxyimino)-α-phenyl acetonitrile;
α-(4-chlorobenzenesulfonyloxyimino)-α-phenyl acetonitrile;
α-(4-nitrobenzenesulfonyloxyimino)-α-phenyl acetonitrile;
α-(4-nitro-2-trifluoromethylbenzenesulfonyloxyimino)-α-phenyl acetonitrile;
α-(benzenesulfonyloxyimino)-α-(4-chlorophenyl) acetonitrile;
α-(benzenesulfonyloxyimino)-α-(2,4-dichlorophenyl) acetonitrile;
α-(benzenesulfonyloxyimino)-α-(2,6-dichlorophenyl) acetonitrile;
α-(benzenesulfonyloxyimino)-α-(4-methoxyphenyl) acetonitrile;
α-(2-chlorobenzenesulfonyloxyimino)-α-(4-methoxyphenyl) acetonitrile;
α-(benzenesulfonyloxyimino)-α-(2-thienyl) acetonitrile;
α-(4-dodecylbenzenesulfonyloxyimino)-α-phenyl acetonitrile;
α-(p-toluenesulfonyloxyimino)-α-(4-methoxyphenyl) acetonitrile;
α-(4-dodecylbenzenesulfonyloxyimino)-α-(4-methoxyphenyl) acetonitrile; and
α-(p-toluenesulfonyloxyimino)-α-(3-thienyl) acetonitrile.

It is a remarkable fact that each of the oxime sulfonate compounds having a cyano group known in the prior art also has an aromatic group such as phenyl group, furyl group, thienyl group and the like.

As is known, phenyl groups as a typical example of the aromatic substituent groups have strong absorption of the ultraviolet light having a wavelength of 248 nm, which is the wavelength of the KrF laser beam frequently used for the pattern-wise exposure of the photoresist layer, so that a photoresist composition containing an oxime sulfonate compound having a phenyl group has a problem that the ultraviolet light is largely absorbed in the resist layer resulting in a decrease in the intensity of the light reaching the bottom of the resist layer in contact with the substrate surface. As a consequence, the cross sectional profile of the line-wise patterned resist layer obtained by development cannot be orthogonal but is trapezoidal with a larger width at the bottom when the photoresist composition is positive-working or inversely trapezoidal with a smaller width at the bottom when the photoresist composition is negative-working. Patterning of contact holes also has a problem of a decrease in the focusing depth latitude due to the low transmissivity of the ultraviolet light through the photoresist layer.

In view of the above described problems in the photoresist compositions due to the low ultraviolet transmissivity through the photoresist layer containing an oxime sulfonate compound with an aromatic group, alternatively, Japanese Patent Kokai 4-210960 proposes use of bis (cyclohexylsulfonyl) diazomethane as an acid generating agent in a photoresist composition free from the problem of ultraviolet absorption. This compound, however, is defective because, though with high transmissivity to ultraviolet light, the acid generated therefrom has a relatively low acid strength so that the sensitivity of the photoresist composition containing the compound cannot be high enough in addition to the problem of low heat resistance of the resist layer formed from the composition.

Besides, the oxime sulfonyl or sulfonate compounds having aromatic groups known in the prior art in general have problems that, when used as an acid generating agent in a photoresist composition, the cross sectional profile of the patterned resist layer is sometimes wavy and, due to their low solubility in an organic solvent used in the preparation of the photoresist composition, the amount thereof contained in the photoresist composition is so limited that the sensitivity of the photoresist composition cannot be high enough or the compound as the acid generating agent can be dissolved in the photoresist composition only by undertaking an additional step of heating resulting in an increase in the costs for the preparation of the photoresist compositions.

SUMMARY OF THE INVENTION

The present invention accordingly has an object to provide a novel and improved photoresist composition containing an acid generating agent or, in particular, an oxime sulfonate compound having a cyano group in the molecule as the acid generating agent free from the above described problems and disadvantages in the prior art photoresist compositions compounded with a conventional oxime sulfonate compound as the acid generating agent.

Thus, the photoresist composition of the present invention is a uniform blend which comprises:

(A) 100 parts by weight of a film-forming resinous compound which is, in the presence of an acid, subject to a change in the solubility in an alkaline solution; and (B) from 0.1 to 30 parts by weight or, preferably, from 1 to 20 parts by weight of an oxime sulfonate compound represented by the general formula

$$NC-CR^1=N-O-SO_2-R^2, \qquad (I)$$

in which $R^1$ and $R^2$ are, each independently from the other, a non-aromatic group or, typically, an unsubstituted or halogen-substituted monovalent aliphatic hydrocarbon group selected from the group consisting of alkyl, cycloalkyl, alkenyl and cycloalkenyl groups.

Among the cyanooxime sulfonate compounds falling within the above given definition of the component (B), particularly effective cyanooxime sulfonate compounds as an acid generating agent in the photoresist composition include those of which the group denoted by $R^1$ in the general formula (I) is a cycloalkenyl group, preferably, such as cyclopentenyl and cyclohexenyl groups and the group denoted by $R^2$ is an alkyl group, preferably, having 1 to 4 carbon atoms.

Further, the component (A) can be an alkali-soluble resin having hydroxy groups of which at least a part of the hydroxy groups are protected by acid-dissociable substituent groups or a combination of an alkali-soluble resin and an acid-crosslinkable compound.

DETAILED DESCRIPTION OF THE PREFERRED EMBODIMENTS

The film-forming resinous compounds which are subject, in the presence of an acid, to a change in the solubility in an alkaline solution, as the component (A) in the inventive photoresist composition can be grossly classified into two classes including, one, those derived from a hydroxy-containing alkali-soluble resin of which the hydroxy groups are protected by acid-dissociable substituent groups to lose solubility in an alkaline solution and, the other, those as a blend of an alkali-soluble resin and an acid-crosslinkable compound or, namely, a curable compound susceptible to crosslinking by the reaction with the catalytic activity of an acid.

When a film-forming resin of the former type is used as the component (A) in combination with an acid generating agent as the component (B) to form a photoresist composition, an acid is generated from the component (B) in the areas of the photoresist layer exposed to actinic rays so as to impart alkali-solubility to the component (A) so that a positive pattern is obtained by the development with an alkaline developer solution by the selective removal of the resist layer in the exposed areas only. When the component (A) is of the latter type, on the other hand, the resinous ingredient as the component (A) is crosslinked and insolubilized in an alkaline developer solution in the areas exposed to actinic rays by the activity of the acid generated from the component (B) in the exposed areas so as to give a negative pattern of the resist layer by the selective removal of the resist layer in the unexposed areas only.

The film-forming alkali-soluble resinous compounds suitable as the component (A) in the inventive photoresist composition is not particularly limitative but it is selected usually from the group consisting of novolac resins obtained by the condensation reaction of a phenolic compound such as phenol, m- and p-cresols, xylenols, trimethyl phenols and the like and an aldehyde compound such as formaldehyde in the presence of an acidic catalyst, hydroxy styrene-based polymeric resins including homopolymers of a hydroxy styrene, copolymers of styrene and a hydroxy styrene, copolymers of a hydroxy styrene and (meth)acrylic acid or an ester thereof and (meth)acrylic resins, e.g. copolymers of (meth)acrylic acid and an ester thereof, each having solubility in an alkaline solution.

The film-forming resinous compound having hydroxy groups protected by acid-dissociable substituent groups includes homopolymers of a hydroxy styrene and copolymers of a hydroxy styrene with another styrene monomer and copolymers of a hydroxy styrene with (meth)acrylic acid or a derivative thereof, of which at least a part of the hydroxy groups are protected by acid-dissociable substituent groups, and copolymers of (meth)acrylic acid with a derivative thereof, of which a part of the carboxylic hydroxy groups are protected by acid-dissociable groups.

The above mentioned styrene monomers to be copolymerized with a hydroxy styrene are exemplified by styrene, α-methylstyrene, 2- and 4-methylstyrenes, 4-methoxystyrene, 4-chlorostyrene and the like. Further, the derivative of (meth)acrylic acid mentioned above is exemplified by (hydroxy)alkyl esters of (meth)acrylic acid such as methyl, ethyl, 2-hydroxyethyl and 2-hydroxypropyl (meth) acrylates as well as (meth)acrylonitrile and (meth) acrylamide.

The acid-dissociable groups to protect the hydroxy groups in the above described hydroxy-containing polymers by substitution are exemplified by alkyloxycarbonyl groups such as tert-butoxycarbonyl and tert-amyloxycarbonyl groups, alkyloxy groups such as tert-butoxy group, alkoxy-substituted alkoxy groups such as ethoxyethoxy and methoxypropoxy groups, acetal groups such as tetrahydropyranyl and tetrahydrofuranyl groups, benzyl group, trimethylsilyl group and the like.

It is preferable to use, as the component (A), a hydroxy-containing polymer of which from 1 to 60% or, more preferably, from 10 to 50% of the hydroxy groups in the polymer are protected by the acid-dissociable substituent groups.

While it is usual that a hydroxy-containing alkali-soluble polymer of which a part of the hydroxy groups are protected by the above mentioned acid-dissociable substituent groups is used as a film-forming ingredient in a positive-working photoresist composition, it is also a possible way to formulate a negative-working photoresist composition capable of giving a patterned resist layer with a high rate of film thickness retention by development in the exposed areas by using such a protected hydroxy-containing polymer of a low degree of protecting substitution in combination with an acid-crosslinkable compound.

When the component (A) of the inventive photoresist composition is a combination of an alkali-soluble resin and an acid-crosslinkable compound, the acid-crosslinkable compound can be selected from hydroxy- or alkoxy-containing amino resins such as melamine resins, urea resins, guanamine resins, glycoluryl-formaldehyde resins, succinylamide-formaldehyde resins, ethyleneurea-formaldehyde resins and the like. These resins can be readily prepared by the methylolation reaction of melamine, urea, guanamine, glycoluryl, succinylamide or ethyleneurea in boiling water with formalin or further by the alkoxylation reaction of the methylolated product with a lower alcohol. Several grades of commercial products of such a resin are available on the market and can be used as such including those sold under the trade names of Nikalacs Mx-750, Mw-80 and Mx-290 (each a product by Sanwa Chemical Co.).

In addition to the above mentioned resinous compounds, the acid-crosslinkable compound can be selected from benzene compounds having more than one alkoxy groups such as 1,3,5-tris(methoxymethoxy) benzene, 1,2,4-tris (isopropoxymethoxy) benzene and 1,4-bis(sec-butoxymethoxy) benzene, phenol compound having more than one hydroxy or alkoxy groups such as 2,6-dihydroxymethyl-p-cresol and 2,6-dihydroxymethyl-p-tert-butyl phenol, and the like.

The above described acid-crosslinkable compounds can be used either singly or as a combination of two kinds or more according to need.

The amount of the acid-crosslinkable compound in the combination thereof with an alkali-soluble resin is in the range from 3 to 70% by weight or, preferably, from 5 to 50% by weight based on the amount of the alkali-soluble resin. When the amount thereof is too small, the photoresist composition cannot be imparted with sufficiently high photosensitivity while, when the amount thereof is too large, the resist layer would suffer from a decrease in the uniformity or evenness along with a decrease in the developability with an alkaline developer solution not to give a good resist pattern.

The component (B) in the inventive photoresist composition is an acid generating agent which is a cyanooxime sulfonate compound represented by the above given general formula (I). The compound is, different from conventional cyanooxime sulfonate compounds, free from any aromatic groups such as a benzene ring, naphthalene ring, furan ring, thiophene ring, pyridine ring and the like.

In the general formula (I), the groups denoted by $R^1$ and $R^2$ are, each independently from the other, a monovalent non-aromatic group including unsubstituted or halogen-substituted aliphatic hydrocarbon groups such as alkyl groups, halogenated alkyl groups, alkenyl groups, cycloalkyl groups and cycloalkenyl groups, alkoxy groups, cycloalkoxy groups, adamantyl groups and the like. The alkyl group preferably has 12 or less of carbon atoms and can be straightly linear or branched as exemplified by methyl, ethyl, n-propyl, isopropyl, n-butyl, isobutyl, sec-butyl, tert-butyl, n-pentyl, n-octyl and n-dodecyl groups. The halogenated alkyl group is selected from those obtained by replacing one or more of the hydrogen atoms in the above named alkyl groups with an atom or atoms of a halogen which can be fluorine, chlorine, bromine or iodine, of which particularly preferred are halogenated alkyl groups having 1 to 4 carbon atoms such as chloromethyl, trichloromethyl, trifluoromethyl and 2-bromopropyl groups.

The alkenyl group is selected preferably from straightly linear and branched alkenyl groups having 2 to 6 carbon atoms such as vinyl, allyl, propenyl, isopropenyl and 2-butenyl groups. The cycloalkyl group is selected preferably from those having 5 to 12 carbon atoms such as cyclopentyl, cyclohexyl, cyclooctyl and cyclododecyl groups. The cycloalkenyl group is selected preferably from those having 4 to 8 carbon atoms such as 1-cyclobutenyl, 1-cyclopentenyl, 1-cyclohexenyl, 1-cycloheptenyl and 1-cyclooctenyl groups. The alkoxy group is selected preferably from those having 1 to 8 carbon atoms such as methoxy, ethoxy, propoxy, butoxy and pentoxy groups. The cycloalkoxy group is selected preferably from those having 5 to 8 carbon atoms such as cyclopentoxy and cyclohexyloxy groups.

By virtue of the absence of aromatic substituent groups in the molecule, the above defined oxime sulfonate compound as the component (B) in the inventive photoresist composition has relatively high transmissivity to the actinic rays or, in particular, deep ultraviolet light used in the pattern-wise exposure of a photoresist layer so that, when the compound is used as an acid generating agent in a photoresist composition, advantages can be obtained that improvements are accomplished in the orthogonality in the cross sectional profile of the patterned resist layer and the focusing-depth latitude in the pattern-wise exposure of the photoresist layer to ultraviolet light.

While it is a problem in the prior art that, as is discussed in Japanese Patent Kokai 4-210960, introduction of a cyclohexyl group into a sulfonyl diazomethane compound to give bis(cyclohexylsulfonyl) diazomethane conventionally used as an acid generating agent in a photoresist composition results in a decrease in the acid strength of the acid generated therefrom by the exposure to actinic rays consequently with a decrease in the photosensitivity of the photoresist composition and a decrease in the heat resistance of the patterned resist layer, it is a quite unexpected discovery that the photoresist composition compounded with the above defined cyanooxime sulfonate compound is free from such disadvantages. The mechanism therefor is, though not well understood, presumably due to the cyano-substituted oxime group in the compound. It is preferable, from the standpoint of obtaining high photosensitivity of the photoresist composition, that the group denoted by $R^2$ in the general formula (I) is selected preferably from the group consisting of alkyl, halogenated alkyl and cycloalkyl groups or, more preferably, from lower alkyl groups having 1 to 4 carbon atoms such as methyl, ethyl, n-propyl, isopropyl and butyl groups, trichloromethyl group, trifluoromethyl group and cyclohexyl group.

The above defined cyanooxime sulfonate compound as the component (B) in the inventive photoresist composition has excellent solubility in an organic solvent used in the preparation of photoresist compositions, presumably, by the introduction of the non-aromatic groups to the oxime sulfonate compound. Accordingly, it is no longer necessary that the acid generating agent is dissolved in an organic solvent by heating in the preparation of a photoresist composition. The outstandingly high solubility of the acid generating agent as the component (B) provides a possibility of formulating the photoresist composition with a large amount thereof consequently giving high photosensitivity of the composition. In this regard, it is preferable to select the group denoted by $R^1$ in the general formula (I) from alkyl, cycloalkyl and cycloalkenyl groups or, in particular, from lower alkyl groups having 1 to 4 carbon atoms, e.g., ethyl, propyl and butyl groups, cyclopentyl group, cyclohexyl group, 1-cyclopentenyl group, 1-cyclohexenyl group, 1-cycloheptenyl group and 1-cyclooctenyl group.

While a photoresist composition compounded with the conventional oxime sulfonate compound disclosed in the above mentioned prior art documents generally has a problem that the patterning work with the photoresist composition is under the influences of standing waves resulting in appearance of a wavy side lines of the cross sectional profile of the patterned resist layer, it is also an unexpected discovery that the photoresist composition compounded with the above defined cyanooxime sulfonate compound is free from such an adverse influence of standing waves to decrease the waviness of the cross sectional profile of the patterned resist layer. The reason therefor is presumably that the substituent groups denoted by $R^1$ and $R^2$ in the oxime sulfonate compound have an effect to promote diffusion of the acid generated from the compound by the pattern-wise irradiation of the photoresist layer with actinic rays in the course of the heat treatment to follow the pattern-wise exposure to actinic rays.

From the standpoint of accomplishing orthogonality in the cross sectional profile of the patterned resist layer without waviness caused by the influences of standing waves, the group denoted by $R^2$ is selected preferably from the group consisting of lower alkyl groups having 1 to 4 carbon atoms such as methyl, ethyl, n-propyl, isopropyl and butyl groups, trichloromethyl group, trifluoromethyl group and cyclohexyl group.

When the above mentioned various requirements are taken into consideration for the cyanooxime sulfonate compound to be used as an acid generating agent in the inventive photoresist composition, it is preferable that the group denoted by R1 in the general formula is an alkyl, cycloalkyl or cycloalkenyl group or, more preferably, a cycloalkenyl group, e.g., cyclopentenyl group, and the group denoted by $R^2$ is an alkyl, halogenated alkyl or cycloalkyl group or, more preferably, an alkyl group having 1 to 4 carbon atoms.

Particular examples of the oxime sulfonate compounds suitable as the component (B) in the inventive photoresist composition include:

α-(methylsulfonyloxyimino)-1-cyclopentenyl acetonitrile;
α-(methylsulfonyloxyimino)-1-cyclohexenyl acetonitrile;
α-(methylsulfonyloxyimino)-1-cycloheptenyl acetonitrile;
α-(methylsulfonyloxyimino)-1-cyclooctenyl acetonitrile;
α-(trifluoromethylsulfonyloxyimino)-1-cyclopentenyl acetonitrile;
α-(trifluoromethylsulfonyloxyimino)cyclohexyl acetonitrile;
α-(ethylsulfonyloxyimino)ethyl acetonitrile;
α-(propylsulfonyloxyimino)-propyl acetonitrile;
α-(cyclohexylsulfonyloxyimino)-cyclopentyl acetonitrile;
α-(cyclohexylsulfonyloxyimino)-cyclohexyl acetonitrile;
α-(cyclohexylsulfonyloxyimino)-1-cyclopentenyl acetonitrile;

and the like. These cyano-substituted oxime sulfonate compounds can be used as the component (B) in the inventive photoresist composition either singly or as a combination of two kinds or more according to need.

The above named cyano-substituted oxime sulfonate compound can be synthesized according to a procedure which is a modification of the synthetic procedure described in the prior art documents. For example, a cyano-substituted oxime group-containing compound of the formula $R^1$—C(CN)=N—OH and a sulfonyl chloride group-containing compound of the formula Cl—$SO_2$—$R^2$ are subjected to a dehydrochlorination reaction according to the reaction equation

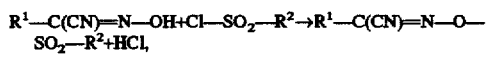

in which each symbol has the same meaning as defined above, in an organic solvent such as tetrahydrofuran, N,N-dimethyl formamide, N,N-dimethyl acetamide, N-methyl pyrrolidone and the like in the presence of a basic catalyst or an acid acceptor such as pyridine, triethylamine and the like. The cyano-substituted oxime group-containing compound as one of the starting reactants can be prepared by a known method such as those disclosed in The Systematic Identification of Organic Compounds, page 181 (1980, John Wiley & Sons), Die Makromolekulare Chemie, volume 108, page 170 (1967) and Organic Syntheses, volume 59, page 95 (1979).

The amount of the component (B) relative to the amount of the component (A) in the inventive photoresist composition is in the range from 0.1 to 30 parts by weight or, preferably, in the range from 1 to 20 parts by weight per 100 parts by weight of the component (A). When the amount of the component (B) is too small, the photoresist composition is poorly imageable in the photolithographic patterning while, when the amount thereof is too large, a decrease is caused in the uniformity of the resist layer formed on the substrate surface along with a decrease in the developability of the latent images in the development treatment not to give an excellently patterned resist layer.

The photoresist composition of the invention is used usually in the form of a solution prepared by dissolving the above described components (A) and (B) each in a specified amount in a suitable organic solvent. Examples of suitable organic solvents include ketone compounds such as acetone, methyl ethyl ketone, cyclohexanone, methyl isoamyl ketone, 2-heptanone and the like; polyhydric alcohols and derivatives thereof such as ethylene glycol, diethylene glycol, propylene glycol and dipropylene glycol as well as monoacetates thereof and monoacetate monoethers thereof, e.g. monomethyl, monoethyl, monopropyl, monobutyl and monophenyl ethers of monoacetates, and the like; cyclic ethers such as dioxane and the like; and esters such as methyl lactate, ethyl lactate, methyl acetate, ethyl acetate, butyl acetate, methyl pyruvate, ethyl pyruvate, methyl methoxypropionate, ethyl ethoxypropionate and the like. These organic solvents can be used either singly or a mixture of two kinds or more according to need.

It is of course optional that the inventive photoresist composition is admixed according to need, in addition to the above described essential ingredients, with various kinds of conventional additives having compatibility therewith including auxiliary resins, plasticizers, stabilizers, coloring agents, surface active agents and the like to improve the properties of the resist layer.

Following is a description of the general procedure for the fine patterning work by using the above described photoresist composition of the invention, which is not particularly different from the conventional procedures. Thus, a substrate such as a semiconductor single crystal silicon wafer is coated with the photoresist composition in the form of a solution by using a suitable coating machine such as a spinner followed by drying to form a photoresist layer which is exposed pattern-wise to actinic rays such as deep ultraviolet light, excimer laser beams and the like through a pattern-bearing photomasks to form a latent image in the resist layer followed by a development treatment thereof by using an aqueous alkaline solution containing an organic alkaline compound such as tetramethylammonium hydroxide in a concentration of 1 to 10% by weight as a developer solution to give a patterned resist layer which is a high-fidelity reproduction of the mask pattern.

Following is a summarization of the advantages obtained in the photolithographic fine patterning by using the inventive photoresist composition in which a non-aromatic cyano-substituted oxime sulfonate compound is used as an acid generating agent. (1) The high transparency of the composition to deep ultraviolet light used in the pattern-wise exposure of the photoresist layer ensures excellent orthogonality of the cross sectional profile of the patterned resist layer as well as good focusing depth characteristics. (2) The high acid strength of the acid generated therefrom by the irradiation with actinic rays ensures excellent photosensitivity of the resist composition and heat resistance of the patterned resist layer. (3) The excellent solubility of the compound in an organic solvent used in the preparation of the photoresist composition has an effect of enhancing the sensitivity of the composition by virtue of an increase in the amount of the acid generating compound, which can be dissolved in a solvent even without heating. (4) The adverse influences by standing waves can be minimized so as to prevent appearance of a wavy contour in the cross sectional profile of the patterned resist layer.

In the following, the photoresist composition of the invention is described in more detail by way of Examples as preceded by a description of the synthetic procedure for the cyano-substituted oxime sulfonate compound used as the acid generating agent in the inventive photoresist compositions.

The term of "parts" in the following Examples always refers to "parts by weight".

PREPARATION EXAMPLE

α-Hydroxyimino-1-cyclopentenyl acetonitrile as the intermediate was prepared in the following manner. Thus, a reaction mixture was prepared from 64.5 g of methyl alcohol, 365 g of xylene, 80 g (2 moles) of sodium hydroxide and 107 g (1 mole) of 1-cyclopentenyl acetonitrile and, while keeping the reaction mixture in a vessel at a temperature of 40° C., 125 g (1.07 moles) of isopentyl nitrito were added dropwise thereinto taking 2 hours followed by further continued agitation of the mixture for additional 2 hours at the same temperature and then for 20 hours at room temperature. Thereafter, the reaction mixture was diluted and emulsified by the addition of water and the pH of the emulsion was adjusted to 14 by the use of an aqueous solution of sodium hydroxide. The emulsion was destroyed by standing and separated into the aqueous and organic phases. After discarding the organic phase, the aqueous phase was acidified with hydrochloric acid followed by extraction of the reaction product contained therein with diethyl ether. The ether solution thus obtained was dehydrated and subjected to evaporation of the ether to give a solid residue which was recrystallized from a toluene solution to give 120 g of a purified product which could be identified to be α-hydroxyimino-1-cyclopentenyl acetonitrile from the analytical results shown below. The above mentioned yield of the product was 88.5% of the theoretical value.

The infrared absorption spectrum of this product compound had absorption bands with peaks at wave numbers of 1294 cm$^{-1}$, 1363 cm$^{-1}$, 1614 cm$^{-1}$, 2244 cm$^{-1}$ and 3317 cm$^{-1}$. The proton nuclear magnetic resonance ($^1$H-NMR) absorption spectrum of the compound measured in heavy methyl alcohol CD$_3$OD as the solvent had peaks of the δ value at 2.02 ppm, 2.50 to 2.60 ppm, 4.89 ppm and 6.35 ppm. These results supported the above mentioned identification of the compound.

In the next place, α-(methylsulfonyloxyimino)-1-cyclopentenyl acetonitrile was prepared from the above obtained α-hydroxyimino-1-cyclopentenyl acetonitrile as the intermediate. Thus, a solution was prepared by dissolving 39.4 g (0.29 mole) of α-hydroxyimino-1-cyclopentenyl acetonitrile obtained above in 400 ml of tetrahydrofuran containing 44.0 g (0.43 mole) of triethylamine and kept at −5° C. Into the solution kept at −5° C. were introduced dropwise 36.5 g (0.32 mole) of mesyl chloride over a period of 2 hours followed by agitation of the mixture at the same temperature for 3 hours and then at about 10° C. for 2 hours. The reaction mixture was freed from tetrahydrofuran by evaporation at 30° C. under reduced pressure to give a crude reaction product which was subjected to purification. Thus, a 60 g portion of the crude product was subjected to several times of recrystallization from an acetonitrile solution to give 35 g of a white crystalline compound having a melting point of 96° C. as the final product which could be identified from the following analytical results to be α-(methylsulfonyloxyimino)-1-cyclopentenyl acetonitrile. The above mentioned yield of the final product corresponds to 50.4% of the theoretical value.

The infrared absorption spectrum of this product compound had absorption bands with peaks at wave numbers of 1189 cm$^{-1}$, 1376 cm$^{-1}$, 1610 cm$^{-1}$, 2242 cm$^{-1}$ and 2940 cm$^{-1}$. The $^1$H-NMR absorption spectrum of the compound measured in heavy chloroform CDCl$_3$ as the solvent had peaks of the δ value at 2.10 ppm, 2.64 to 2.70 ppm, 3.26 ppm and 6.90 ppm. These results supported the above mentioned identification of the compound. Further, the ultraviolet absorption spectrum of the compound was measured in propylene glycol monomethyl ether as the solvent to detect absorption bands having peak wavelengths at 214.5 nm and 278.5 nm with molar absorption coefficients of ε=6010 and ε=10600, respectively. The molar absorption coefficient ε at a wavelength of 248 nm was 1500 indicating high transmissivity to the KrF laser beam conventionally used in the pattern-wise exposure of the photoresist layer.

Example 1

A positive-working photoresist composition was prepared by dissolving, in 500 parts of propylene glycol monomethyl ether acetate, 30 parts of a first polyhydroxystyrene substituted by tert-butoxycarbonyloxy groups for 39% of the hydroxy groups and having a weight-average molecular weight of 10000, 70 parts of a second polyhydroxystyrene substituted by ethoxyethoxy groups for 39% of the hydroxy groups and having a weight-average molecular weight of 10000, 3 parts of the α-(methylsulfonyloxyimino)-1-cyclopentenyl acetonitrile prepared in the Preparation Example described above, 0.1 part of triethylamine, 0.2 part of salicylic acid and 2 parts of N,N-dimethylacetamide followed by filtration of the solution through a membrane filter of 0.2 μm pore diameter.

This photoresist solution was applied to the surface of a silicon wafer on a spinner followed by drying on a hot plate at 90° C. for 90 seconds to form a dried photoresist layer having a thickness of 0.7 μm, which was exposed pattern-wise on a minifying projection exposure machine (Model NSR-2005EX8A, manufactured by Nikon Co.) in doses stepwise increased with increments of each 1 mJ/cm$^2$ by varying the exposure time followed by a post-exposure baking treatment at 110° C. for 90 seconds and developed with a 2.38% by weight aqueous solution of tetramethylammonium hydroxide at 23° C. for 65 seconds followed by rinse with water for 30 seconds and drying. Recording was made there for the minimum exposure dose in mJ/cm$^2$, which was 4 mJ/cm$^2$ in this case, as a measure of the sensitivity by which the resist layer in the exposed areas was completely dissolved away in the development treatment.

Further, a scanning electron microscopic photograph was taken of the cross sectional profile of the patterned resist line of 0.23 μm width to find that the cross sectional profile was excellently orthogonal standing upright on the substrate surface without waviness. The focusing-depth latitude around a contact hole of 0.3 μm diameter was 1.6 μm. Heat resistance of the thus formed patterned resist layer was examined by heating the silicon wafer not to detect any slight deformation of the edges of the patterned resist line even by heating at 130° C.

Comparative Example 1

The same testing procedure as in Example 1 was repeated excepting replacement of the α-(methylsulfonyloxyimino)-1-cyclopentenyl acetonitrile as the acid generating agent with the same amount of α-(p-toluenesulfonyloxyimino)-4-methoxyphenyl acetonitrile. The results were that the sensitivity was 6 mJ/cm², the cross sectional profile of the line-patterned resist layer of 0.23 μm width was trapezoidal with waviness due to the influences of standing waves and the focusing-depth latitude around a contact hole of 0.3 μm diameter was 1.2 μm although the heat resistance of the patterned resist layer was about equivalent to that with the inventive photoresist composition in Example 1.

Comparative Example 2

The same testing procedure as in Example 1 was repeated excepting replacement of the α-(methylsulfonyloxyimino)-1-cyclopentenyl acetonitrile as the acid generating agent with the same amount of bis(cyclohexylsulfonyl) diazomethane. The results were that the sensitivity was 30 mJ/cm², the cross sectional profile of the line-patterned resist layer of 0.23 μm width was orthogonal standing upright on the substrate surface without waviness, the focusing-depth latitude around a contact hole of 0.3 μm diameter was 1.6 μm and the heat resistance of the patterned resist layer was inferior to show collapsing of the edges of a line-patterned resist layer by heating at 125° C.

Example 2

A negative-working photoresist composition was prepared by dissolving, in 650 parts of propylene glycol monomethyl ether, 100 parts of a copolymer of styrene and hydroxystyrene having a weight-average molecular weight of 2500, 10 parts of a urea resin (Mx-290, a product by Sanwa Chemical Co.), 0.3 part of a melamine resin (Mx-750, a product by Sanwa Chemical Co.) and 8.9 parts of the α-(methylsulfonyloxyimino)-1-cyclopentenyl acetonitrile prepared in the Preparation Example described above.

This photoresist solution was applied to the surface of a silicon wafer on a spinner followed by drying on a hot plate at 100° C. for 90 seconds to form a dried photoresist layer having a thickness of 0.7 μm, which was exposed patternwise to an excimer laser beam on a minifying projection exposure machine (Model NSR-2005EX8A, manufactured by Nikon Co.) followed by a post-exposure baking treatment at 130° C. for 90 seconds and developed with a 2.38% by weight aqueous solution of tetramethylammonium hydroxide at 23° C. for 65 seconds followed by rinse with water for 30 seconds and drying. Recording was made there for the minimum exposure dose in mJ/cm², which was 1 mJ/cm² in this case, as a measure of the sensitivity by which incipient pattern formation could be detected on the exposed areas of the resist layer in the development treatment.

Comparative Example 3

The same testing procedure as in Example 2 was repeated excepting replacement of the α-(methylsulfonyloxyimino)-1-cyclopentenyl acetonitrile as the acid generating agent with the same amount of tris(2,3-dibromopropyl) isocyanurate to find that the sensitivity was as low as 20 mJ/cm².

What is claimed is:

1. A photoresist composition which comprises, as a uniform blend:

(A) 100 parts by weight of a film-forming resinous compound which is, in the presence of an acid, subject to a change in the solubility in an alkaline solution; and (B) from 0.1 to 30 parts by weight of an oxime sulfonate compound represented by the general formula

   $$NC-CR^1=N-O-SO_2-R^2,$$

in which $R^1$ and $R^2$ are, each independently from the other, a non-aromatic monovalent group.

2. The photoresist composition as claimed in claim 1 in which the non-aromatic monovalent group is an alkoxy group or a cycloalkoxy group.

3. The photoresist composition as claimed in claim 1 in which the non-aromatic monovalent group is an adamantyl group.

4. The photoresist composition as claimed in claim 1 in which the non-aromatic monovalent group is selected from the group consisting of alkyl groups, cycloalkyl groups, alkenyl groups and cycloalkenyl groups.

5. The photoresist composition as claimed in claim 1 in which the component (A) is a hydroxy-containing alkali-soluble resin of which, at least a part of the hydroxy groups are protected by acid-dissociable substituent groups to lose solubility in an alkaline solution.

6. The photoresist composition as claimed in claim 5 in which from 1 to 60% of the hydroxy groups in the hydroxy-containing alkali-soluble resin are protected by the acid-dissociable substituent groups.

7. The photoresist composition as claimed in claim 6 in which from 10 to 50% of the hydroxy groups in the hydroxy-containing alkali-soluble resin are protected by the acid-dissociable substituent groups.

8. The photoresist composition as claimed in claim 1 in which the component (A) is a combination of an alkali-soluble resin and an acid-crosslinkable compound.

9. The photoresist composition as claimed in claim 8 in which the amount of the acid-crosslinkable compound is in the range from 3% to 70% by weight based on the amount of the alkali-soluble resin.

10. The photoresist composition as claimed in claim 1 in which the amount of the component (B) is in the range from 1 to 20 parts by weight per 100 parts by weight of the component (A).

11. The photoresist composition as claimed in claim 1 in which the group denoted by $R^1$ is cyclopentenyl group and the group denoted by $R^2$ is an alkyl group having 1 to 4 carbon atoms.

* * * * *